(12) United States Patent
Watanabe et al.

(10) Patent No.: US 8,017,960 B2
(45) Date of Patent: Sep. 13, 2011

(54) INFRARED EMITTING DIODE AND METHOD OF ITS MANUFACTURE

(75) Inventors: Haruhiko Watanabe, Chiyoda-ku (JP); Yoshinori Kurosawa, Chiyoda-ku (JP); Takashi Araki, Chiyoda-ku (JP)

(73) Assignee: Dowa Electronics Materials Co., Ltd., Tokyo (JP)

( * ) Notice: Subject to any disclaimer, the term of this patent is extended or adjusted under 35 U.S.C. 154(b) by 685 days.

(21) Appl. No.: 11/813,321

(22) PCT Filed: Dec. 26, 2005

(86) PCT No.: PCT/JP2005/023749
§ 371 (c)(1),
(2), (4) Date: Jul. 28, 2008

(87) PCT Pub. No.: WO2006/073077
PCT Pub. Date: Jul. 13, 2006

(65) Prior Publication Data
US 2009/0008658 A1     Jan. 8, 2009

(30) Foreign Application Priority Data

Jan. 5, 2005  (JP) ................... 2005-001018

(51) Int. Cl.
*H01L 29/22* (2006.01)
*H01L 29/227* (2006.01)
(52) U.S. Cl. .......... 257/98; 257/103; 257/E33.001; 438/22; 438/25; 438/29; 438/46; 438/47
(58) Field of Classification Search .......... None
See application file for complete search history.

(56) References Cited

U.S. PATENT DOCUMENTS

| 4,757,357 | A   |   | 7/1988  | Varon et al. |         |
|-----------|-----|---|---------|--------------|---------|
| 5,491,350 | A   | * | 2/1996  | Unno et al.  | 257/99  |
| 6,319,778 | B1  | * | 11/2001 | Chen et al.  | 438/273 |
| 6,586,875 | B1  | * | 7/2003  | Chen et al.  | 313/506 |

(Continued)

FOREIGN PATENT DOCUMENTS

JP     S61-49486  A     3/1986

(Continued)

OTHER PUBLICATIONS

Japanese Office Action dated Nov. 25, 2008, in a counterpart Japanese patent application JP2005-001018, citing Foreign Patent document No. 1 which has English abstract and JP05-67806 and JP08-293622, which have been submitted in a previous IDS. Concise explanation of relevance of the Japanese Office Action is attached as Transmittal Letter.

*Primary Examiner* — Zandra Smith
*Assistant Examiner* — Khanh Duong
(74) *Attorney, Agent, or Firm* — Chen Yoshimura LLP

(57) ABSTRACT

An infrared emitting diode that can be utilized as a high power and rapidly responsive infrared light source for both infrared and remote control communications is disclosed which comprises at least one p-type clad layer containing $Al_xGa_{1-x}As$ of p type where $0.15 \leq x \leq 0.45$, an active layer containing $Al_yGa_{1-y}As$ of p type where $0 \leq y \leq 0.01$ and at least one n-type clad layer containing $Al_zGa_{1-z}As$ where $0.15 \leq z \leq 0.45$ wherein said active layer has a thickness of 2 to 6 μm and which has an emission peak wavelength of 880 to 890 nm at room temperature.

3 Claims, 4 Drawing Sheets

U.S. PATENT DOCUMENTS 7,129,527 B2 * 10/2006 Yang ............................ 257/98

FOREIGN PATENT DOCUMENTS

| JP | 61-128581 A | 6/1986 |
| JP | 63-178568 A | 7/1988 |
| JP | 04-179279 A | 6/1992 |
| JP | 05-067806 A | 3/1993 |
| JP | 08-293622 A | 11/1996 |
| JP | 2000-138640 A | 5/2000 |

* cited by examiner

INFRARED EMITTING DIODE AND METHOD OF ITS MANUFACTURE

TECHNICAL FIELD

The present invention relates to an infrared emitting diode that can be utilized for both infrared communications and remote control communications, as well as a method of its manufacture.

BACKGROUND ART

Of light emitting diodes (hereinafter, referred to conveniently as "LEDs") which emit light when a forward current is passed through the pn junction of compound semiconductors, LEDs of AlGaAs and GaAs families are widely used in the fields of infrared communications and remote control communications. For example, as LEDs for use in infrared communications which require higher power and increased speed of operation to meet with larger volume communications, those of double-hetero (DH) structure are used. In an LED of DH structure, an active layer is more advantageous for high power and rapid responsiveness if it is thinner. And, generally it is made to have a thickness of 1 μm.

Patent Reference 1 below describes an LED of DH structure as mentioned above in which the active layer has an effective impurity (dopant) added thereto and formed of germanium (Ge) and has a thickness of 0.5 to 1.5 μm so that the LED is obtained that is high in power and reliability and satisfactory in responsiveness.

Also, as LEDs for use in remote control communications, those of homojunction type are used which are by liquid phase growth of GaAs. The pn junction in such an LED is formed utilizing the so-called pn reversal, or the inversion from p type to n type, of silicon (Si) used as a dopant in the liquid phase, at a growth temperature. Since Si forms a deeper impurity level than other possible dopants in GaAs, the GaAs homojunction type LED has emission wavelengths widely distributed in a wavelength range longer than the GaAs absorption edge (870 nm). However, a long diffusion length of its carriers leaves its pulse responsiveness slow. As a result, its rise time (Tr) and fall time (Tf) have had their limits of several μ seconds.

Patent Reference 1: Japanese Patent laid open application: JP H08-293622 A

DISCLOSURE OF THE INVENTION

Problems to be Solved by the Invention

In recent years, varieties of small terminal apparatus such as cell phones have been developed including those equipped with both functions of infrared and remote control communications. Used for transmission and reception between terminal devices, infrared communications utilize infrared rays of, e.g., 850 to 900 nm while remote control communications use infrared rays of, e.g., 880 to 940 nm, in a wavelength band higher in sensitivity at the receiver. With both these two functions combined, there hitherto had to be prepared two sorts of LEDs varying in emission wavelength.

For an LED usable for both infrared and remote control communications as mentioned above it has been necessary to have an emission wavelength, e.g., a peak wavelength region, longer than 880 nm that is a wavelength higher in sensitivity at the receiver. However, LEDs of DH structure described in Patent Reference 1 has the problem in having their emission peak wavelengths in the range between 800 and 870 nm, which can give rise to no LED of a wavelength longer than 870 nm.

While on the other hand, Si added GaAs homojunction type LEDs can yield infrared emission of a wavelength longer than 870 nm, they cannot allow such high responsiveness that can cope with infrared communications.

In view of the above, it is an object of the present invention to provide an infrared emitting diode usable for both infrared and remote control communications, which has a high power and is capable of rapidly responding.

Means for Solving the Problems

As a result of zealous investigations, the present inventors have come to know in LEDs of AlGaAs family that adjusting the thickness of an active layer to 2 to 6 μm can yield an emission peak wavelength longer than 870 nm, that when the effective impurity in a p-type active layer is formed of Ge, an LED can be made which has an emission peak wavelength in a range between 880 and 890 nm, is higher in power than homojunction type LEDs and has a rapid responsiveness by being reduced in both Tr and Tf and that the LED gives rise to emission properties that justify its use for both infrared and remote control communications, and have arrived at the present invention.

In order to achieve the object mentioned above, there is provided in accordance with the present invention an infrared emitting diode characterized in that it comprises at least one p-type clad layer containing $Al_xGa_{1-x}As$ of p type where $0.15 \leq x \leq 0.45$, an active layer containing $Al_yGa_{1-y}As$ of p type where $0 \leq y \leq 0.01$ and at least one n-type clad layer containing $Al_zGa_{1-z}As$ of n type where $0.15 \leq z \leq 0.45$ wherein the active layer has a thickness of 2 to 6 μm and that it is usable as an infrared light source both for infrared and remote control communications.

According to the present invention, adjusting the p-type active layer to have a thickness of 2 to 6 μm can control the infrared emission wavelength as desired so that an LED can be provided that can be used as an infrared light source both for infrared and remote control communications.

Preferably, the active layer has an effective impurity formed of Ge. According this makeup that the active layer has an effective impurity formed of Ge, a high power and rapidly responding infrared emitting diode can be realized.

The infrared emitting diode preferably has an emission peak wavelength of 880 to 890 nm at room temperature. This allows the infrared emitting diode to be used as an infrared light both for infrared and remote control communications.

The present invention also provides a method of making an infrared emitting diode usable as an infrared light source both for infrared and remote control communications, characterized in that the infrared emitting diode is made by the steps of: epitaxially growing on a GaAs substrate at least one p-type clad layer containing $Al_xGa_{1-x}As$ of p type where, an active layer containing of p type and at least one n-type clad layer; and removing the GaAs substrate after having the clad layers epitaxially grown thereon while leaving the clad layers.

According to the method of making mentioned above, a high power and rapidly responsive infrared emitting diode can be made on a mass production basis and at a reduced cost, which has an emission peak wavelength ranging between 880 and 890 nm for both uses in infrared and remote control communications.

Effects of the Invention

According to the present invention, a high power and rapidly responding infrared emitting diode is provided that can be utilized for both infrared communications and remote control communications. Although in an apparatus having functions of infrared and remote control communications two different sorts of infrared emitting diodes varying in wavelength have had to be used, the present invention make it sufficient to use a single infrared emitting diode and makes it unnecessary to use two sorts of infrared emitting diodes.

Also, according to the method of the present invention for making an infrared emitting diode, a high power and rapidly responding infrared emitting diode can be made on a mass-production basis and at a reduced cost, which can be utilized for both infrared and remote control communications.

EXPLANATION OF REFERENCE CHARACTERS

Figure 1:
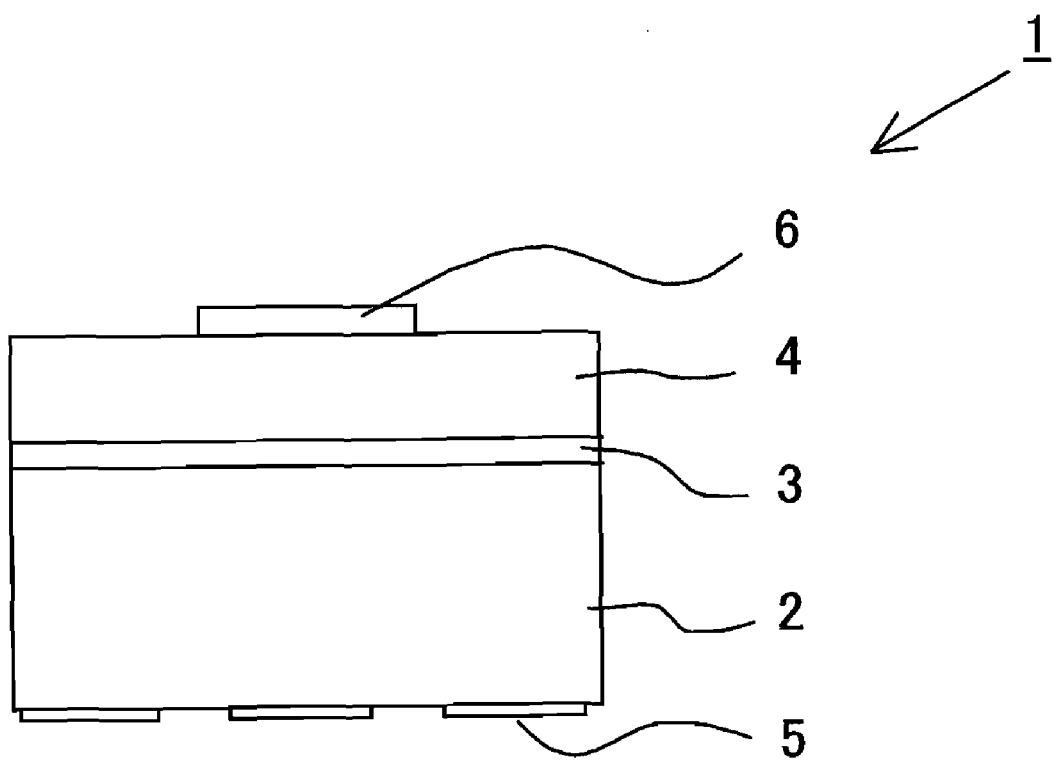
FIG. 1 is a cross sectional view diagrammatically illustrating the structure of an infrared emitting diode according to the present invention.

1: infrared emitting diode
2: p-type clad layer
3: active layer (p-type active layer)
4: n-type clad layer
5: p-layer electrode
6: n-layer electrode
10: boat
12: base
13: partition
14: GaAs substrate

BEST MODES FOR CARRYING OUT THE INVENTION

An explanation is given hereinafter of an infrared emitting diode embodying the present invention with reference to drawing figures.

FIG. 1 is a cross sectional view diagrammatically illustrating the structure of an infrared emitting diode 1 according to the present invention. The infrared emitting diode of the present invention has a double hetero (DH) structure comprising a p-type clad layer 2, an active layer 3 and an n-type clad layer 4 wherein the p-type clad layer 2 and the n-type clad layer 4 are formed with p-layer electrodes 5 and an n-layer electrode 6, respectively. The electrodes 5 and 6 formed on the lower and upper surfaces of the infrared emitting diode 1 can have their shapes chosen as desired. It should be noted here that the infrared emitting diode 1 may have the p-type electrodes 5, the p-type clad layer 2, the active layer 3, the n-type clad layer 4 and the n-layer electrode 6 arranged in the order opposite to as shown in FIG. 1, namely from up to down.

The p-type clad layer 2 may consist of at least one p-type clad layer 2 containing $Al_xGa_{1-x}As$ of p type where x is a mixed crystal composition and $0.15 \leq x \leq 0.45$. The p-type clad layer 2 may have a two-layer structure in which this p-type $Al_xGa_{1-x}As$ layer has a p-type GaAs layer further formed thereon. For example, with the p-type GaAs layer being a highly doped layer, it is possible to form the p-layer electrodes 5 easily and to reduce a series resistance while improving the response performance.

The n-type clad layer 4 may consist of at least one n-type clad layer 4 containing $Al_zGa_{1-z}As$ of n type where z is a mixed crystal composition and $0.15 \leq z \leq 0.45$. The n-type clad layer 4 may have a two-layer structure in which this n-type $Al_zGa_{1-z}As$ layer has a n-type GaAs layer further formed thereon. For example, with the n-type GaAs layer being an impurity dense layer, it is possible to form the n-layer electrode 6 easily and to reduce a series resistance while improving the response performance.

The p-type and n-type clad layers 2 and 4 in operation need to have both effects of confinement electrons and positive holes as carriers and light confinement with respect to the active layer 3, thus requiring that x and z for Al compositions in the $Al_xGa_{1-x}As$ and $Al_zGa_{1-z}As$ layers should be more than 0.15.

On the other hand, the upper limits of x and z for the Al compositions may in principle be large for confinement both carriers and light. However, it is not desirable to bring about the problem that with a rise of Al composition the infrared emitting diode electrically energized may corrode and degrade or that the ohmic loss then causes a rise in forward voltage. For these reasons, it is desirable that for the Al compositions, $0.15 \leq x, z \leq 0.45$.

The active layer 3 is inserted between the p-type and n-type clad layers 2 and 4, and the active layer 3 provides a region that becomes an emission layer. The active layer 3 consists of a layer containing $Al_yGa_{1-y}As$ of p type where $0 \leq y \leq 0.01$, that is a layer containing GaAs or a layer containing $Al_yGa_{1-y}As$ where y is a mixed crystal composition and $0 \leq y \leq 0.01$. If y for the Al composition is more than 0.01, it is not desirable because it then becomes hard to emit infrared light of longer wavelength.

The conduction type of the active layer 3 is preferably of p type from the standpoint of emission efficiency. And, for the sake of rapid responsiveness and high reliability, the p-type active layer 3 should preferably have its effective impurity formed of Ge. In order for the infrared emitting diode 1 to be highly responsive, the p-type active layer 3 may have an impurity density generally of $1 \times 10^{18}$ cm$^{-3}$ or more. The "effective impurity" in the present invention refers to an impurity that is effectively dominant. For example, there may be added a minor component such as zinc (Zn) or magnesium (Mg) when lower in impurity density than Ge impurity in the p-type active layer 3.

Making the active layer (3) 2 to 6 μm thick allows the infrared emitting diode at room temperature to have an emission peak wavelength of 880 to 890 nm. If the thickness of the active layer 3 is less than 2 μm, it is not desirable because it then shifts the emission wavelength to shorter than 880 nm. On the other hand, if the active layer 3 is more than 6 μm thick it is undesirable because it then saturates the amount of shift of the emission wavelength to longer side and also lowers the emission power.

The emission wavelength of an LED varies depending on the temperature of an emission region, i.e. the pn junction. If the ambient temperature is high or if the junction operated with high current is high in temperature, the emission wavelength at which the emission intensity is the largest, viz. the emission peak wavelength is shifted to the longer wavelength side. For that, the peak emission wavelength of an infrared emitting diode of the present invention is defined by a measured value at room temperature when the forward direct current is 20 mA.

An infrared emitting diode of the present invention which can be made to have an emission peak wavelength of 880 to 890 nm can be used as a high power, infrared light source for application to both infrared and remote control communications. And, having a quick pulse response at the time of emission, the infrared emitting diode is able to meet not only with remote control communications which are low in speed but also with high speed, infrared communications.

Mention is next made of a method of making an infrared emitting diode according to a form of implementation of the present invention.

The infrared emitting diode 1 of the present invention can be manufactured in a manner as described as follows. First, the p-type clad layer 2, the active layer 3 and the n-type clad layer 4 are grown epitaxially in sequence on a GaAs substrate to obtain a DH structure thereon. The sequence of growth may be opposite to as described and may be the order of the n-type clad layer 4, the active layer 3 and the p-type clad layer 2. The GaAs substrate used may be of any type, i.e., p type, n type, semi-conductive or undoped, if it is removed after epitaxial growth. In case the substrate is not removed, it may be a p-type or n-type GaAs substrate used corresponding to the clad layer to be first grown.

Subsequently, the GaAs substrate on which the DH structure has been formed is removed while leaving the DH structure.

Thereafter, the electrodes 5 and 6 are formed on the p-type clad layer 2 and the n-type clad layer 4, respectively, of the DH structure, which is then divided into chips of a selected area. Surfaces of such chips may then be roughened to enhance their light takeout efficiency.

Subsequently, the lower electrode of such a chip is attached to one of lead frames, its upper electrode is connected to another of the lead frames by wire bonding using gold or Al wire and the upper side of the lead frame on which the chip is mounted is coated with epoxy, thereby forming a bomb-shell like infrared emitting diode.

For the epitaxial growth, use may be made of a liquid phase growth or MOCVD process. In the case of the liquid phase growth process, slow cooling or temperature difference method may be used. For the sake of enhancing the light takeout efficiency, it is preferable to remove the GaAs substrate. In this case, the DH structure itself preferably has a thickness ranging between 100 μm and 200 μm so that it may not be broken in a post-processing step such as for electrode forming. For that, the epitaxial crystal growth process step makes it preferable to use the liquid phase growth process by which thick growth layers and high quality crystals can easily be obtained and which is suitable for mass production and is at low cost.

Mention is next made in detail of the epitaxial growth of a DH structure.

Figure 2:
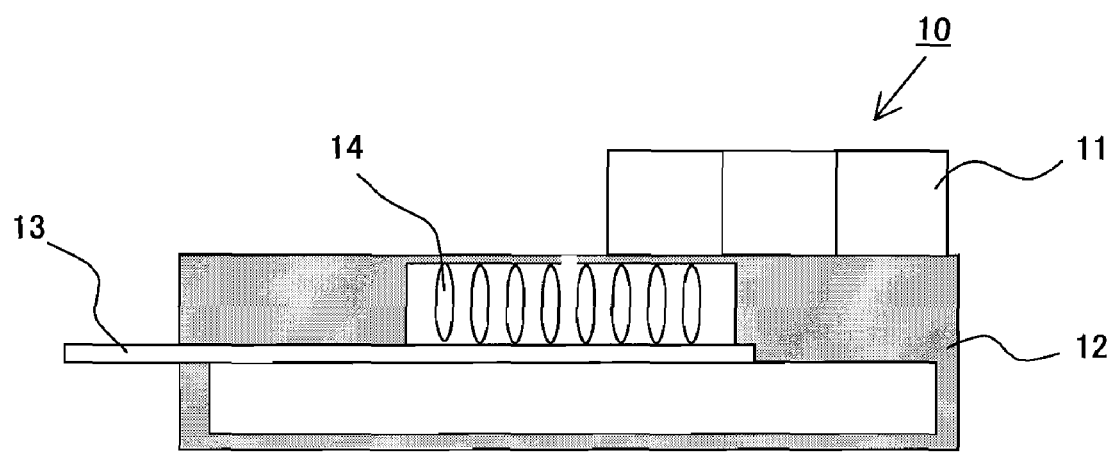
FIG. 2 is a cross sectional view diagrammatically illustrating a boat used for the epitaxial growth of an infrared emitting diode according to the present invention.

FIG. 2 is a cross sectional view diagrammatically illustrating a boat used for the epitaxial growth of an infrared emitting diode according to the present invention. A boat 10 used for the epitaxial growth of an infrared emitting diode as shown in FIG. 2 comprises three parts of a crucible 11, a base 12 and a partition 13. These parts may be made of carbon.

The crucible 11 comprises at least three tanks for the reason that three such solution tanks are required which vary in composition and dopant as necessary for epitaxially growing the p-type clad layer 2, the active layer 3 and the n-type clad layer 4. Each tank of the crucible 11 is charged with a Ga raw material, an Al raw material, a GaAs raw material and a dopant mixed together individually so as to make a composition desired for a respective layer of the DH structure. The growth raw materials charged in each tank for a respective layer constitute a source solution. Also, a GaAs substrate 14 is inserted in the base 12.

Mention is next made of the epitaxial growth by slow cooling method of a DH structure using the boat 10.

First, the boat 10 charged with the source solutions in the crucible 11 is inserted into a quartz tube within an electric furnace and after nitrogen-gas purging and evacuation, has hydrogen gas flowing over it. It is then raised to a growth temperature by the electric furnace and held for a given period of time.

Next, as the boat 10 is slowly cooled by control of the electric furnace, the crucible 11 is moved to introduce a source solution into the base 12 in which the GaAs substrate 14 is inserted. And, epitaxial growth is effected at a selected temperature for a selected time period at a selected rate of slow cooling, and the source solution after growth is separated from the GaAs substrate by operating the partition 13. Repeating these allows the respective layers 2, 3 and 4 of the DH structure to be grown.

Here, since the segregation coefficient of AlAs is larger than that of GaAs, growing a thick clad layer 2, 4 causes the AlAs component in Ga to be reduced and makes the Al composition x, z in the clad layer 2, 4 gradient. On the other hand, the active layer 3 as it is much thinner than the clad layer 2, 4 scarcely causes any variation in the Al composition.

According to the method of making an infrared emitting diode in accordance with the present invention, an infrared emitting diode which is made to have an emission peak wavelength of 880 to 890 nm and which can thus be used as a high power and highly responsive, infrared light source for application to both infrared and remote control communications can be mass-produced and at low cost.

EXAMPLE

The present invention will be described hereinafter in further detail with respect to a specific example thereof.

In the Example of the present invention, a DH structure made of a p-type clad layer 2, a p-type active layer 3 and an n-type clad layer 4 was epitaxially grown on a GaAs substrate, using slow cooling method in conjunction with the liquid phase growth process. In epitaxially growing, the thicknesses of the p-type clad layer 2 and the n-type clad layer 4 were fixed at about 100 μm and about 60 μm, respectively, and the thickness of $AlGa_{1-y}As$ layer as the p-type active layer 3 was variously varied. A growth temperature was chosen from a range between 600 and 900° C.

TABLE 1

| Grown Layer | Al composition | Impurity Density ($cm^{-3}$) | Impurity | Thickness (μm) |
|---|---|---|---|---|
| p-type clad layer | 0.15-0.45 | $3 \times 10^{17}$ | Zn | 100 |
| p-type active layer | 0.0 | $2 \times 10^{18}$ | Ge | d |
| n-type clad layer | 0.20-0.45 | $6 \times 10^{17}$ | Te | 60 |

Table 1 shows an example of Al compositions, impurity densities, impurities (dopants) used and thicknesses for the layers of the DH structure made in the Example. As is apparent from Table 1, the p-type clad layer 2 has a composition x of 0.15 to 0.45, an impurity (Zn) density of $3 \times 10^{17}$ $cm^{-3}$ and a thickness of 100 μm. The p-type active layer 3 has a composition y of 0, namely GaAs, an effective impurity (Ge)

density of $2\times10^{18}$ cm$^{-3}$ and thickness d µm varied variously in a range between 0.5 µm and 8 µm. The n-type clad layer 4 has a composition z of 0.20 to 0.45, an impurity (Te) density of $6\times10^{17}$ cm$^{-3}$ and a thickness of 60 µm. The compositions x and z are shown above by their respective widths of variation within the layer thicknesses.

Next, an infrared emitting diode 1 was formed by the method described above, namely by removing the GaAs substrate, forming the p-type clad layer 2 and the n-type clad layer 4 with electrodes 5 and 6 and dividing the structure into chips of a desired area. Such an infrared emitting diode chip in size has an area of 0.32 mm×0.32 mm and, if the thickness of the active layer which is sufficiently thinner than the clad layers is neglected, can be regarded as having a thickness of about 160 µm.

Mention is next made of emission properties of the infrared emitting diode in the Example.

Figure 3:
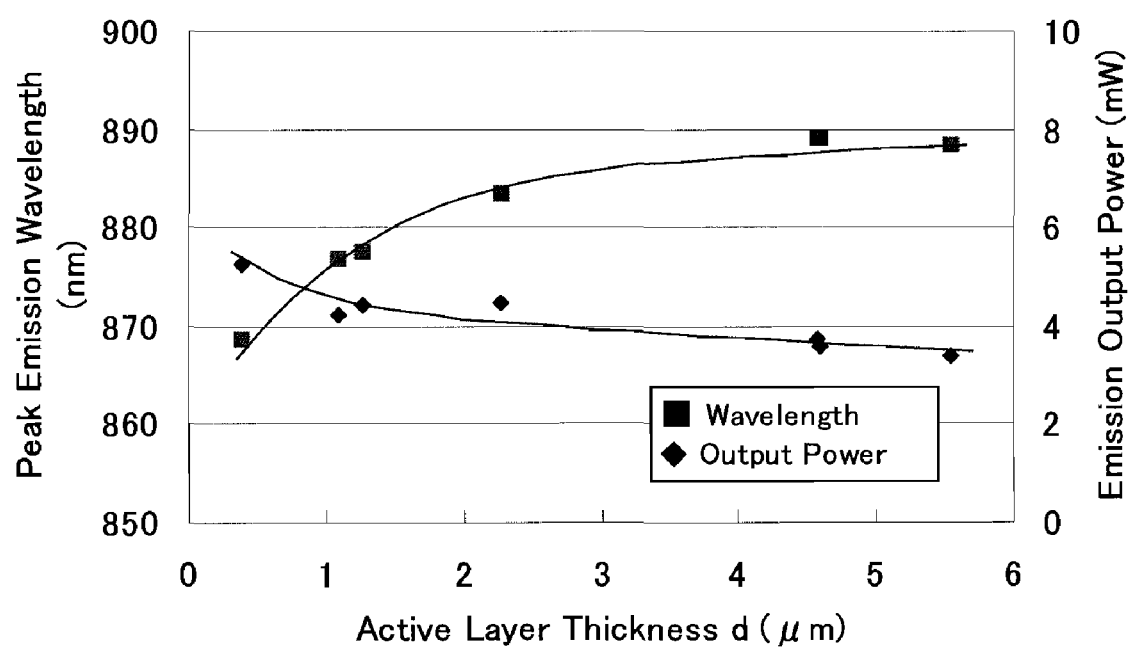
FIG. 3 is a graph illustrating a peak emission wavelength with respect to varying thickness d of the active layer of an infrared emitting diode in Example and an emission output power for the peak emission wavelength.

FIG. 3 is a graph illustrating a peak emission wavelength with respect to varying thickness d of the active layer of the infrared emitting diode in the Example and an emission output power for the peak emission wavelength. In the graph, the abscissa axis represents the thickness d(µm) of the active layer whereas the ordinate axes at the left and right hand sides represent the peak emission wavelength (in nm) and the light output power (mW) at the peak emission wavelength, respectively. The infrared emitting diode 1 has a current of 20 mA passed therethrough at room temperature (25° C.). The emission properties were measured with a spectrometer (made by Ohtsuka Densi, K. K., model MCPD 3000).

As is apparent from the graph, the peak emission wavelength varies from about 870 nm to about 890 nm when the thickness d of the active layer is varied from 0.5 µm to 6 µm. And, when the thickness d of the active layer is varied from 2 µm to 6 µm, it is seen that the peak emission wavelength varies from about 880 nm to about 890 nm. Then, at the peak emission wavelength there was obtained an output power as high as around 4 mW. It is thus seen that a peak emission wavelength of 880 nm to 890 nm is obtained which falls on a boundary in the infrared region that can be used for both infrared and remote control communications and which yields a high output power.

Figure 4:
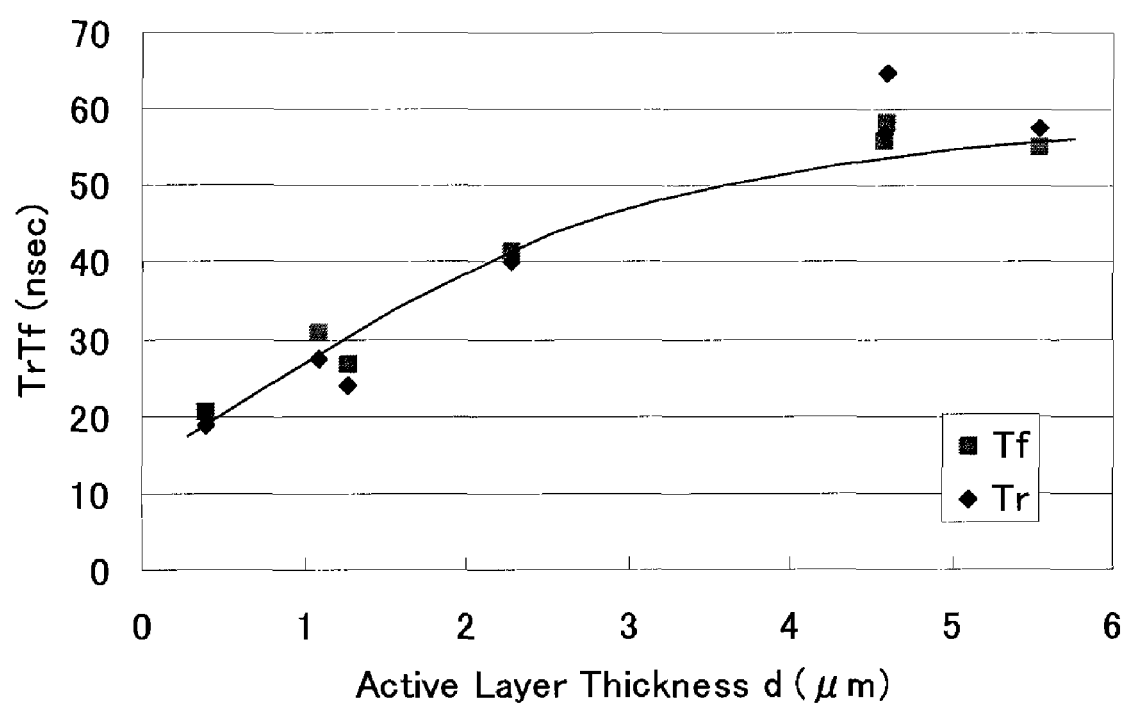
FIG. 4 is a graph illustrating a rise time Tr and a fall time Tf of emission with respect to varying thickness d of the active layer of the infrared emitting diode in Example.

FIG. 4 is a graph illustrating a rise time Tr and a fall time Tf of emission with respect to varying thickness d of the active layer of the infrared emitting diode in Example. In the graph, the abscissa axis represents the thickness d (µm) of the active layer and the ordinate axis represents the rise and fall times Tr and Tf (nsec) which are indicated by diamond (♦) and square (■) symbols, respectively. In measuring the rise and fall times Tr and Tf here, the infrared emitting diode 1 had pulses applied thereto having a pulse width of 125 nsec, a duty ratio of 25% and a peak current of 500 mA.

As is apparent from the graph, it is seen that when the thickness d of the active layer is varied from 2 µm to 6 µm, the rise and fall times Tr and Tf are nearly the same as around about 37 to 55 nsec, indicating that a response performance is had capable of meeting with the cutoff frequency as required in the infrared communications.

Mention is next made of an example of emission properties of the infrared emitting diode 1 in which the active layer is 2.8 µm and 4.8 µm thick.

Measured values shown for the peak emission wavelength and emission output power were those measured when a forward direct current of 20 mA was applied at room temperature. The infrared emitting diode having an active layer thickness of 2.8 µm had a peak emission wavelength of 885 nm and its half-value breadth (the emission wavelength breadth where the emission output power becomes one half) of 51 nm. Its emission output power was 3.82 mW. Also, the rise and fall times Tr and Tf when a pulsed current of 500 mA was driven were each 30 nsec. On the other hand, the infrared emitting diode having an active layer thickness of 4.8 µm had a peak emission wavelength of 885 nm and its half-value breadth of 51 nm, too. Its emission output power was 3.59 mW. Also, the rise and fall times Tr and Tf when a pulsed current of 500 mA was driven were each 65 nsec.

The present invention is not limited to these specific examples but, suffice it to say, includes various modifications and alterations thereof that can be made within the scope of the invention set forth in the appended claims. For example, the infrared emitting diode is not limited to only those epoxy-coated but should be applicable also to infrared emitting diode chips for varieties of modules.

INDUSTRIAL APPLICABILITY

An infrared emitting diode according to the present invention which is made to have an emission peak wavelength of 880 nm to 890 nm can thus be used as a high power, rapidly responsive infrared light source for both infrared communications and remote control communications. It can therefor be used as the infrared light source for high-speed infrared communications and is applicable, for example, to an infrared light source for IrDA (an abbreviation of Infrared Data Association as a standard instituting association for infrared communications).

What is claimed is:

1. An infrared emitting diode usable as an infrared light source for both infrared and remote control communications, characterized in that it comprises:
    at least one p-type clad layer containing $Al_xGa_{1-x}As$ of p type where $0.15 \leq x \leq 0.45$;
    an active layer containing $Al_yGa_{1-y}As$ of p type where $0 \leq y \leq 0.01$; and
    at least one n-type clad layer containing $Al_zGa_{1-z}As$ of n type where $0.15 \leq z \leq 0.45$, wherein said active layer has a thickness of 2.8 to 6 µm,
    said active layer has an effective impurity formed of Ge and an impurity concentration of said active layer is $10^{18}$cm$^{-3}$ or more, and
    said infrared emitting diode has an emission peak wavelength of 880 to 890 nm at room temperature.

2. A method of making an infrared emitting diode usable as an infrared light source both for infrared and remote control communications as set forth in claim 1, characterized in that the infrared emitting diode is made by the steps of:
    epitaxially growing on a GaAs substrate at least one p-type clad layer containing $Al_xGa_{1-x}As$ of p type where $0.15 \leq x \leq 0.45$, an active layer containing $Al_yGa_{1-y}As$ of p type where $0 \leq y \leq 0.01$ and at least one n-type clad layer containing $Al_zGa_{1-z}As$ of n type where $0.15 \leq z \leq 0.45$; and
    removing the GaAs substrate after having said clad layers epitaxially grown thereon while leaving said clad layers.

3. The infrared emitting diode as set forth in claim 1, characterized in that a rise time Tr and a fall time Tf in a pulse response of the infrared emitting diode are ranging from 37 to 55 nsec.

\* \* \* \* \*